(12) United States Patent
Ishikawa et al.

(10) Patent No.: US 12,191,183 B2
(45) Date of Patent: Jan. 7, 2025

(54) WAFER PLACEMENT TABLE AND METHOD OF MANUFACTURING THE SAME

(71) Applicant: NGK INSULATORS, LTD., Nagoya (JP)

(72) Inventors: Masaki Ishikawa, Handa (JP); Yuji Akatsuka, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 502 days.

(21) Appl. No.: 17/453,352

(22) Filed: Nov. 3, 2021

(65) Prior Publication Data
US 2022/0230905 A1    Jul. 21, 2022

(30) Foreign Application Priority Data
Jan. 20, 2021  (JP) ................... 2021-007360

(51) Int. Cl.
*H01L 21/683*   (2006.01)
*B32B 7/12*    (2006.01)

(52) U.S. Cl.
CPC ........... *H01L 21/6833* (2013.01); *B32B 7/12* (2013.01); *B32B 2457/00* (2013.01)

(58) Field of Classification Search
CPC .................................................. H01L 21/6833
See application file for complete search history.

(56) References Cited

U.S. PATENT DOCUMENTS

| 9,412,579 B2 * | 8/2016 | Sadjadi ............... H01L 21/3065 |
| 10,515,836 B2 * | 12/2019 | Tsuchida ............ H01L 21/6833 |
| 2007/0223167 A1 | 9/2007 | Hattori et al. |
| 2014/0159325 A1 | 6/2014 | Parkhe et al. |

(Continued)

FOREIGN PATENT DOCUMENTS

| CN | 103907181 A * | 7/2014 | .......... B23Q 3/1543 |
| JP | 2007-258610 A | 10/2007 | |

(Continued)

OTHER PUBLICATIONS

Korean Office Action (Application No. 10-2021-0154786) dated Aug. 16, 2023 (with English translation) (11 pages).

(Continued)

*Primary Examiner* — Eric A. Gates
(74) *Attorney, Agent, or Firm* — BURR PATENT LAW, PLLC

(57) ABSTRACT

A wafer placement table includes a first ceramic substrate having a wafer placement surface on an upper surface; a second ceramic substrate disposed on a lower surface side of the first ceramic substrate; a metal bonding layer that bonds a lower surface of the first ceramic substrate and an upper surface of the second ceramic substrate; a connection member including an upper base and a lower base, the connection member being embedded in the second ceramic substrate with the upper base in contact with the metal bonding layer; and a power supply terminal electrically connected to the lower base of the connection member, wherein the connection member has a portion in which an area of cross section when the connection member is cut by a plane parallel to the upper base increases from a side of the upper base to a side of the lower base.

6 Claims, 6 Drawing Sheets

(56) References Cited

U.S. PATENT DOCUMENTS

2017/0069520 A1\* 3/2017 Unno .................... H05B 3/748
2018/0174878 A1 6/2018 Kimura et al.
2023/0311451 A1\* 10/2023 Yoshimoto ............ B32B 15/043

FOREIGN PATENT DOCUMENTS

| JP | 2017-022284 A | | 1/2017 | |
|----|---------------|---|--------|---|
| JP | 2018-006737 A | | 1/2018 | |
| JP | 6292977 B2 | \* | 3/2018 | ........... G02F 1/1303 |
| KR | 20090076845 A | \* | 7/2009 | |
| KR | 10-2011-0011256 A | | 2/2011 | |
| KR | 10-2015-0094685 A | | 8/2015 | |
| KR | 10-2018-0027495 A | | 3/2018 | |

OTHER PUBLICATIONS

Japanese Office Action (with English translation) dated Aug. 29, 2023 (Application No. 2021-007360).

\* cited by examiner

Fig. 4A
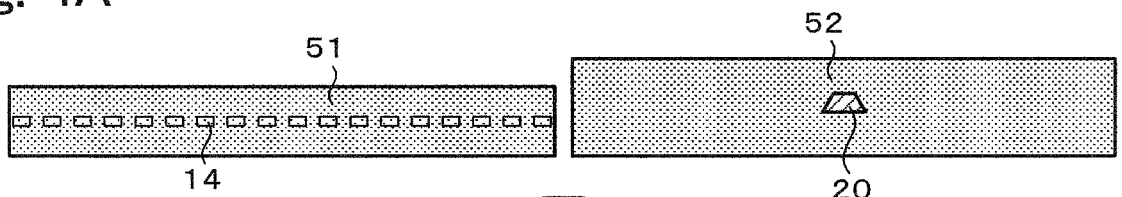
Fig. 4B
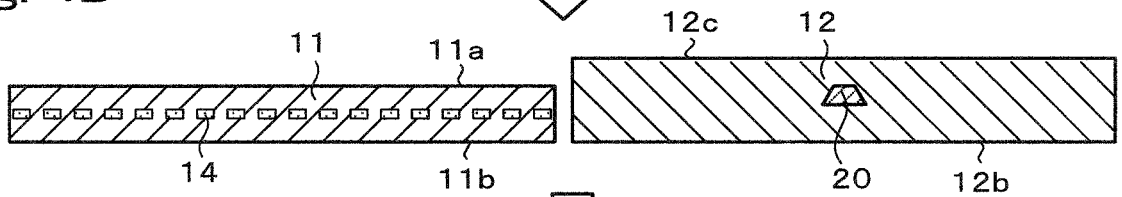
Fig. 4C
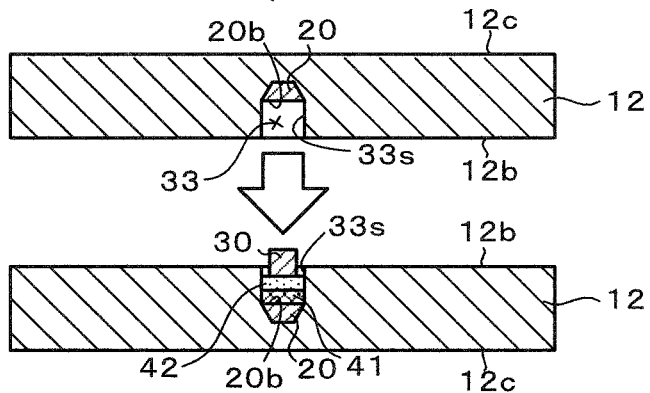
Fig. 4D
Fig. 4E
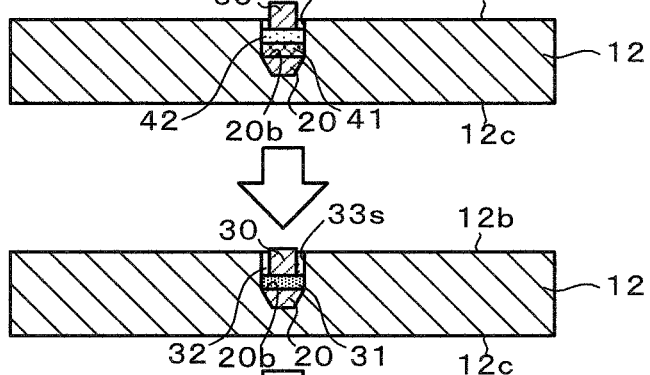
Fig. 4F
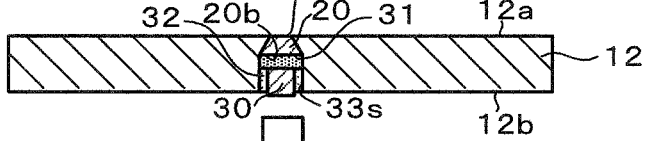
Fig. 4G
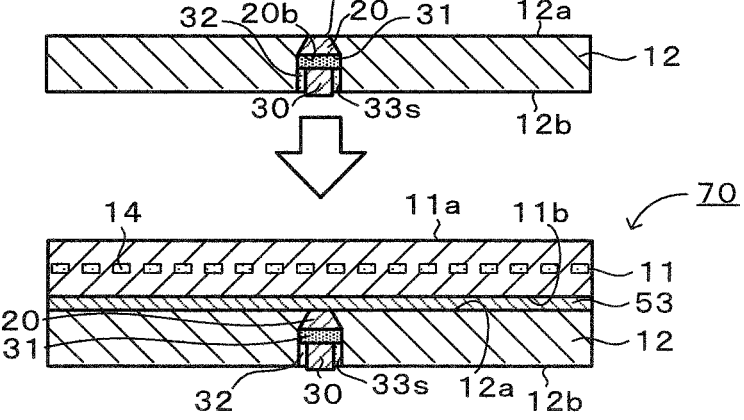

WAFER PLACEMENT TABLE AND METHOD OF MANUFACTURING THE SAME

BACKGROUND OF THE INVENTION

1. Field of the Invention

The present invention relates to a wafer placement table and method of manufacturing the same.

2. Description of the Related Art

A wafer placement table, which uses a metal bonding layer as an electrode to bond ceramic substrates, is conventionally known. For example, PTL 1 discloses an electrostatic chuck that uses a metal bonding layer as an RF electrode.

CITATION LIST

Patent Literature

PTL 1: JP 2018-006737 A

SUMMARY OF THE INVENTION

Such an electrostatic chuck is manufactured, for example, by the following manner. Specifically, first, a first ceramic substrate having a wafer placement surface, and a second ceramic substrate in which a connection member is embedded are produced. Subsequently, grinding work is performed on one surface of the second ceramic substrate so as to expose one surface of the connection member, and a ground surface is formed. The surface on the opposite side of the wafer placement surface of the first ceramic substrate, and the ground surface of the second ceramic substrate are bonded via a metal bonding layer. Thus, if the adhesion between the second ceramic substrate and the connection member is low, crack may occur in the second ceramic substrate due to a load at the time of the grinding work. In addition, the connection member may come off from the second ceramic substrate due to a load at the time of the grinding work.

The present invention has been devised to solve such a problem, and it is a main object to prevent the occurrence of crack in the ceramic substrate at the time of manufacturing so that the connection member is unlikely to come off.

A wafer placement table of the present invention includes: a first ceramic substrate having a wafer placement surface on an upper surface; a second ceramic substrate disposed on a lower surface side of the first ceramic substrate; a metal bonding layer that bonds a lower surface of the first ceramic substrate and an upper surface of the second ceramic substrate; a connection member including an upper base and a lower base, the connection member being embedded in the second ceramic substrate with the upper base in contact with the metal bonding layer; and a power supply terminal electrically connected to the lower base of the connection member, wherein the connection member has a portion in which an area of cross section when the connection member is cut by a plane parallel to the upper base increases from a side of the upper base to a side of the lower base.

In the wafer placement table, the connection member embedded in the second ceramic substrate has a portion in which the area of cross section when the connection member is cut by a plane parallel to its upper base increases from the upper base to the lower base. Therefore, for example, as compared with the case where the shape of the connection member is cylindrical, the area of the lateral surface of the connection member is larger, thus the contact area between the second ceramic substrate and the connection member is increased, and the adhesion between the second ceramic substrate and the connection member is improved. Thus, even if a step of exposing the upper base of the connection member embedded in the second ceramic substrate by grinding its surface on which a metal bonding layer is formed is included when a wafer placement table is manufactured, crack is unlikely to occur in the second ceramic substrate. In addition, even if a load is applied to the connection member in the step, the lateral surface of the connection member is caught by the second ceramic substrate, thus is unlikely to come off.

Note that the "upper", "lower" in the present specification do not represent an absolute positional relationship but represents a relative positional relationship. Therefore, depending on the orientation of the wafer placement table, the "upper", "lower" may refer to "lower" "upper", or refer to "left", "right", or refer to "front", "back".

In the wafer placement table of the present invention, the second ceramic substrate may have a hole for inserting the power supply terminal in the lower surface of the second ceramic substrate, and the lateral surface of the power supply terminal may be bonded to the lateral surface of the hole. In this manner, the lateral surface of the power supply terminal is fixed to the lateral surface of the hole of the second ceramic substrate, thus the connection member together with the power supply terminal can be prevented from coming off from the second ceramic substrate.

In the wafer placement table of the present invention, the connection member may be a member in which metal meshes are stacked in multiple stages. In this manner, even when the wafer placement table is heated or cooled, the connection member is likely to expand and contract because it is made of metal mesh, and ceramic enters gaps in the meshes, thus the thermal expansion coefficient becomes closer to that of the second ceramic substrate. Therefore, crack is unlikely to occur in the second ceramic substrate.

In the wafer placement table of the present invention, the shape of the connection member may be such that the area of cross section when the connection member is cut by a plane parallel to its upper base increases from the upper base to the lower base. In this manner, the connection member has a relatively simple shape, thus the connection member can be produced relatively easily. In this case, the shape of the connection member may be a truncated cone shape, a truncated hemisphere shape or a shape having a lateral surface inwardly curved as compared with the truncated cone shape. In this manner, the connection member has a simple shape, thus the connection member can be produced easily.

A method of manufacturing a wafer placement table of the present invention includes: (a) a step of preparing a first ceramic substrate having a wafer placement surface on an upper surface, and a second ceramic substrate in which a connection member including an upper base and a lower base is embedded; (b) a step of forming a bonding surface by grinding the second ceramic substrate so as to expose the upper base of the connection member; and (c) a step of metal bonding a lower surface of the first ceramic substrate and the bonding surface of the second ceramic substrate, wherein the connection member embedded in the second ceramic substrate prepared in step (a) has a portion in which an area of cross section when the connection member is cut by a plane parallel to the upper base increases from a side of the upper base to a side of the lower base.

In a method of manufacturing the wafer placement table, the connection member embedded in the second ceramic substrate prepared in step (a) has a portion in which the area of cross section when the connection member is cut by a plane parallel to its upper base increases from the upper base side to the lower base side. Therefore, for example, as compared with the case where the shape of the connection member is cylindrical, the area of the lateral surface of the connection member is larger, thus the contact area between the second ceramic substrate and the connection member is increased, and the adhesion between the second ceramic substrate and the connection member is improved. Thus, when a bonding surface is formed by grinding the second ceramic substrate so as to expose the upper base of the connection member in step (b), crack is unlikely to occur in the second ceramic substrate. In addition, even if a load is applied to the connection member in the step (b), the lateral surface of the connection member is caught by the second ceramic substrate, thus is unlikely to come off.

BRIEF DESCRIPTION OF THE DRAWINGS

FIGS. 4A to 4G are explanatory diagrams illustrating an example of a method of manufacturing the electrostatic chuck 10.

DETAILED DESCRIPTION OF THE INVENTION

Figure 1:
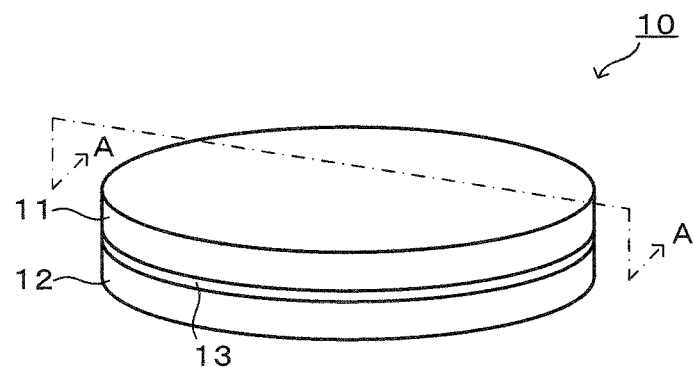
FIG. 1 is a perspective view of an electrostatic chuck 10.
Figure 2:
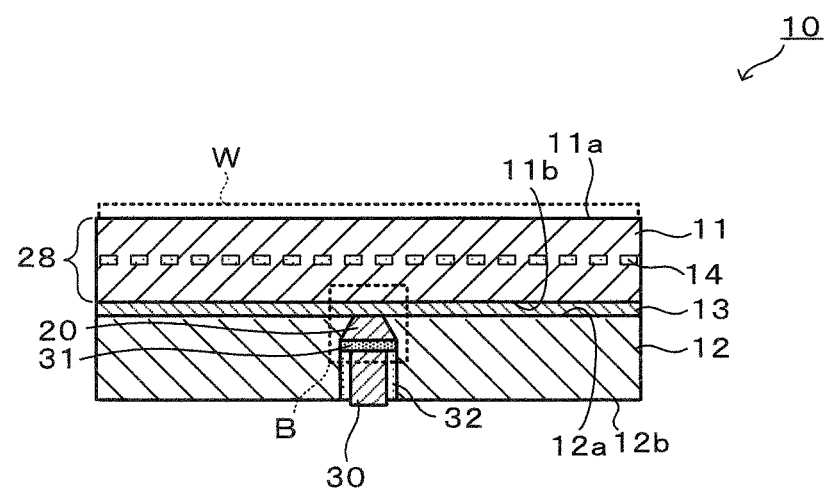
FIG. 2 is a cross sectional view taken along A-A of FIG. 1.
Figure 3:
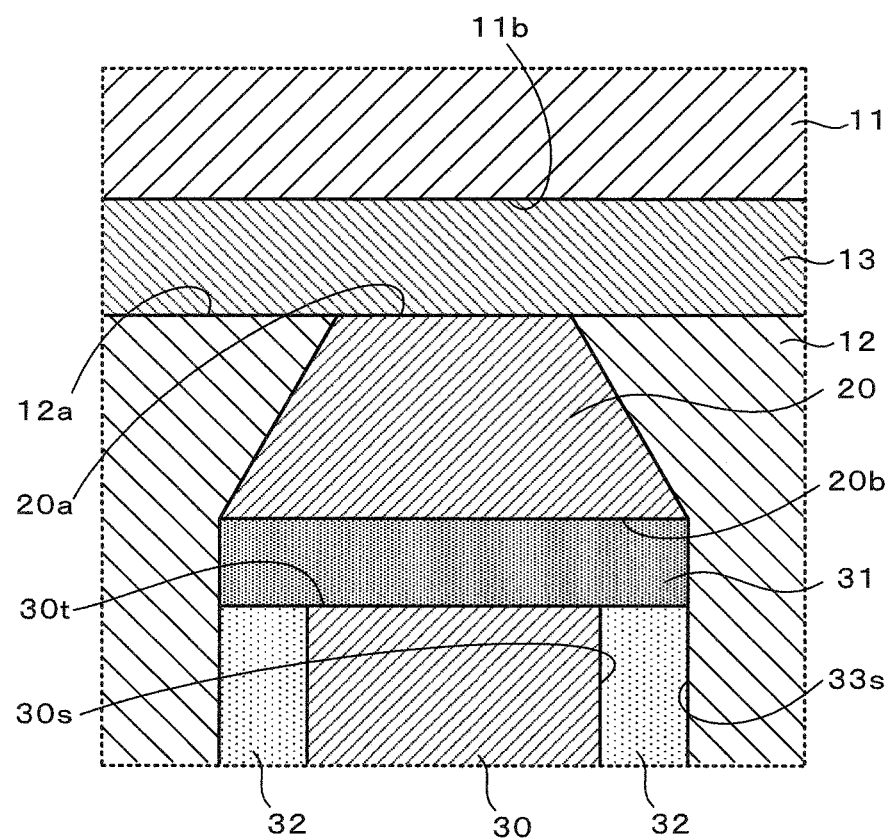
FIG. 3 is an enlarged view of portion B of FIG. 2.

A preferred embodiment of the present invention will be described below with reference to the drawings. FIG. 1 is a perspective view of an electrostatic chuck 10, FIG. 2 is a cross sectional view taken along A-A of FIG. 1, and FIG. 3 is an enlarged view of portion B of FIG. 2.

The electrostatic chuck 10 is an example of the wafer placement table of the present invention, and includes a first ceramic substrate 11, a second ceramic substrate 12, a metal bonding layer 13, a connection member 20, and a power supply terminal 30.

The first ceramic substrate 11 is a disk plate having the same diameter as that of a silicon wafer W which undergoes plasma treatment, and made of ceramic (for example, alumina and aluminum nitride). The diameter of the first ceramic substrate 11 is not particularly limited, however, may be 250 to 350 mm, for example. The upper surface of the first ceramic substrate 11 serves as a wafer placement surface 11a. A resistance heating element 14 is embedded in the first ceramic substrate 11. The resistance heating element 14 is comprised of a material of a simple substance or a compound (such as a carbide) of W, Mo, Ti, Si, Ni as the main component, a material in a combination of these, or a mixed material of one of these and the raw material for the first ceramic substrate 11. The resistance heating element 14 is formed in a one-stroke pattern so that the entire surface of the first ceramic substrate 11 is wired. When a voltage is applied to the resistance heating element 14, it generates heat and the wafer W is heated. The area where the resistance heating element 14 is wired is circular in a plan view, and is provided on a plane parallel to the wafer placement surface 11a. Note that the "parallel" refers to the case of not completely parallel within a range of tolerance, in addition to the case of completely parallel.

The second ceramic substrate 12 is disposed on the surface (the lower surface) side on the opposite side of the wafer placement surface 11a of the first ceramic substrate 11. The second ceramic substrate 12 has the same shape as the first ceramic substrate 11, and is formed of ceramic which is the same material as for the first ceramic substrate 11. The second ceramic substrate 12 includes the connection member 20 embedded therein.

The metal bonding layer 13 bonds the lower surface of the first ceramic substrate 11 and the upper surface of the second ceramic substrate 12. Thus, the lower surface of the first ceramic substrate 11 is referred to as a bonding surface 11b, and the upper surface of the second ceramic substrate 12 is referred to as a bonding surface 12a. The metal bonding layer 13 is comprised of, for example, an Al containing material, such as an Al—Si—Mg based or Al—Mg based material. The thickness of the metal bonding layer 13 is not particularly limited, however, is preferably 1 to 300 μm, and more preferably 50 to 150 μm. In addition, the outer circumference of the metal bonding layer 13 preferably does not protrude from the outer circumference of the first ceramic substrate 11. The metal bonding layer 13 is formed by TCB (thermal compression bonding), for example. Here, TCB is a publicly known method by which a metal bonding material is inserted between two members to be bonded, and the two members are pressure-bonded with the members heated to a temperature lower than or equal to the solidus temperature of the metal bonding material. The metal bonding layer 13 is used as an electrostatic electrode in the present embodiment. The area (the entirety of the first ceramic substrate 11) from the bonding surface 11b to the wafer placement surface 11a of the first ceramic substrate 11 functions as a dielectric layer 28. When a DC voltage is applied to the metal bonding layer 13, the wafer W placed on the wafer placement surface 11a is adsorbed and fixed to the wafer placement surface 11a, and when application of the DC voltage is stopped, adsorbing and fixing of the wafer W to the wafer placement surface 11a is stopped.

The connection member 20 includes an upper base 20a and a lower base 20b, and is embedded in the second ceramic substrate 12 with the upper base 20a in contact with the metal bonding layer 13. The shape of the connection member 20 has a portion in which the area of cross section when the connection member 20 is cut by a plane parallel to the upper base 20a increases from the upper base 20a side to the lower base 20b side. In the present embodiment, the shape of the connection member 20 is such that the area of cross section increases from the upper base 20a to the lower base 20b, and specifically is a truncated cone shape. The connection member 20 is a bulk body (massive body) produced with, for example, a mixed material obtained by adding ruthenium alloy (for example, RuAl) to tungsten carbide, or metal such as Mo. The surface area of the upper base 20a of the connection member 20 is preferably 50% or more and 98% or less of the surface area of the lower base 20b.

One end face 30t of the power supply terminal 30 is electrically connected to the lower base 20b of the connection member 20, and the other end face is connected to an external DC power supply which is not illustrated. The power supply terminal 30 is formed of, for example, metal such as Ni or Mo, and is inserted in a hole 33 (see FIGS. 4A to 4G) formed in the lower surface 12b of the second ceramic substrate 12. The end face 30t of the power supply terminal 30 is bonded to the lower base 20b of the connection member 20 by a terminal end face bonding layer 31. The terminal end face bonding layer 31 is a layer which includes ceramic particles and a metal wax material, and in which the metal wax material is inserted in gaps between the ceramic particles. Alumina ceramic particles and aluminum nitride ceramic particles are preferable as the ceramic particles. The metal wax materials are filled in gaps between the ceramic particles in the terminal end face bonding layer 31, which thus electrically connects the power supply terminal 30 and the connection member 20. A lateral surface 30s of the power supply terminal 30 is bonded to a lateral surface 33s of the hole 33 by a terminal lateral surface bonding layer 32. The terminal lateral surface bonding layer 32 is a layer formed of a metal wax material. For example, an Au—Ni wax material, an Al wax material, and an Ag wax material are preferable as the metal wax material.

Next, a method of manufacturing the electrostatic chuck 10 will be described with reference to FIGS. 4A to 4G. FIGS. 4A to 4G are explanatory diagrams illustrating an example of a method of manufacturing the electrostatic chuck 10.

First, the first ceramic substrate 11 which has the wafer placement surface 11a and in which the resistance heating element 14 is embedded, and the second ceramic substrate 12 in which the connection member 20 is embedded are prepared. Specifically, as illustrated in FIG. 4A, a disk-shaped first ceramic molded body 51 (a previous body of the first ceramic substrate 11) in which the resistance heating element 14 is embedded and a disk-shaped second ceramic molded body 52 (a previous body of the second ceramic substrate 12) in which the connection member 20 is embedded are produced. This step is referred to as step (1). In step (1), the first ceramic molded body 51 and the second ceramic molded body 52 are produced by a mold casting method or the like. Here, the "mold casting method" is a method of obtaining a molded body by pouring a ceramic slurry containing ceramic raw material powder and a molding agent into a mold, and causing a chemical reaction of the molding agent in the mold to mold the ceramic slurry. For example, an agent which contains isocyanate and polyol, and produces a molded body by a urethane reaction may be used as the molding agent. Subsequently, as illustrated in FIG. 4B, the first ceramic molded body 51 and the second ceramic molded body 52 are each hot press sintered while applying a pressure thereto in a thickness direction to produce the first ceramic substrate 11 and the second ceramic substrate 12. This step is referred to as step (2). These step (1) and step (2) correspond to step (a) in the method of manufacturing a wafer placement table of the present invention.

Next, as illustrated in FIG. 4C, the hole 33 is formed in the lower surface 12b of the second ceramic substrate 12 so as to expose the lower base 20b of the connection member 20 embedded in the second ceramic substrate 12. This step is referred to as step (3). In step (3), the hole 33 is formed by grind processing, cutting processing, or blast processing. Note that in step (3), the connection member 20 is unlikely to come off from the second ceramic substrate 12 because the load applied to the connection member 20 at the time of forming the hole 33 in the second ceramic substrate 12 is low.

Next, the power supply terminal 30 is inserted into the hole 33. Specifically, as illustrated in FIG. 4D, the second ceramic substrate 12 is placed so that the hole 33 is directed upward. The power supply terminal 30 is inserted into the hole 33 with ceramic powder 41 and a metal wax material 42 including multiple ceramic particles placed at the lower base 20b of the connection member 20. This step is referred to as step (4). In step (4), for example, alumina ceramic and aluminum nitride ceramic can be used as the ceramic powders 41. Also, in step (4), an Au—Ni wax material, an Al wax material, and an Ag wax material can be used as the metal wax material 42.

Next, the power supply terminal 30 and the connection member 20 are connected. Specifically, first, the second ceramic substrate 12 is heated so that the temperature of the metal wax material 42 exceeds a melting point, and the metal wax material 42 is melted. The melted metal wax material 42 permeates into the ceramic powder 41 to fill the gaps between the ceramic particles of the ceramic powder 41, and enters between the lateral surface 30s of the power supply terminal 30 and the lateral surface 33s of the hole 33. The metal wax material 42 is then cooled to be solidified. Then, as illustrated in FIG. 4E, the terminal end face bonding layer 31 with the metal wax material 42 permeated into gaps between the ceramic particles is formed, and the terminal lateral surface bonding layer 32 is formed of the metal wax material 42. Consequently, the end face 30t of the power supply terminal 30 is bonded to the lower base 20b of the connection member 20, and the lateral surface 30s of the power supply terminal 30 is bonded to the lateral surface 33s of the hole 33. This step is referred to as step (5). In step (5), the lateral surface 30s of the power supply terminal 30 is fixed to the lateral surface 33s of the hole 33 of the second ceramic substrate 12. Thus, the connection member 20 together with the power supply terminal 30 can be prevented from coming off from the second ceramic substrate 12.

Next, the second ceramic substrate 12 is placed so that the hole 33 is directed downward, then as illustrated in FIG. 4F, the bonding surface 12a is formed by performing grind processing on the upper surface 12c of the second ceramic substrate 12 so as to expose the upper base 20a of the connection member 20. This step is referred to as step (6). Also, step (6) corresponds to step (b) in the method of manufacturing a wafer placement table of the present invention. The connection member 20 has a portion in which the area of cross section when the connection member 20 is cut by a plane parallel to the upper base 20a increases from the upper base 20a side to the lower base 20b side. In the present embodiment, the shape of the connection member 20 is such that the area of cross section increases from the upper base 20a side to the lower base 20b side, and specifically is a truncated cone shape. Therefore, as compared with the case where the shape of the connection member 20 is cylindrical, the contact area between the second ceramic substrate 12 and the connection member 20 is increased, and the adhesion between the second ceramic substrate 12 and the connection member 20 is improved. Thus, in step (6), crack is unlikely to occur in the second ceramic substrate 12. In addition, even if a load is applied to the connection member 20 in the step (6), the lateral surface of the connection member 20 is caught by the second ceramic substrate 12, thus is unlikely to come off.

The bonding surface 1*l*b on the opposite side of the wafer placement surface 11*a* of the first ceramic substrate 11, and the bonding surface 12*a* of the second ceramic substrate 12 are metal bonded. Specifically, first, as illustrated in FIG. 4G, a flat plate-shaped metal bonding material 53 having the same diameter as that of the second ceramic substrate 12 is placed on the bonding surface 12*a* of the second ceramic substrate 12, and the first ceramic substrate 11 is placed on the metal bonding material 53 so that the bonding surface 11*b* of the first ceramic substrate 11 is in contact with the metal bonding material 53. In this manner, a laminated body 70 with the metal bonding material 53 inserted between the first ceramic substrate 11 and the second ceramic substrate 12 is produced. This step is referred to as step (7). In step (7), an Al—Mg based bonding material and an Al—Si—Mg based bonding material can be used as the metal bonding material 53. Subsequently, the laminated body 70 is pressurized at a temperature (for example, a temperature at the solidus temperature minus 20° C. or higher and the solidus temperature or lower) lower than or equal to the solidus temperature of the metal bonding material 53, and the first ceramic substrate 11 and the second ceramic substrate 12 are TCB bonded, then the temperature is returned to the room temperature. Thus, the metal bonding material 53 turns to the metal bonding layer 13, and the electrostatic chuck 10 is obtained. This step is referred to as step (8). These step (7) and step (8) correspond to step (c) in the method of manufacturing a wafer placement table of the present invention.

Next, an example of use of the electrostatic chuck 10 of the present embodiment will be described. The wafer W is placed on the wafer placement surface 11*a* of the electrostatic chuck 10, and the wafer W is adsorbed to the wafer placement surface 11*a* by an electrostatic force by applying a voltage across the metal bonding layer 13 and the wafer W. In this state, plasma CVD film formation is performed or plasma etching is performed on the wafer W. Also, the temperature of the wafer W is controlled at a constant by heating the wafer W by application of a voltage to the resistance heating element 14, and/or cooling the wafer W by circulation of a refrigerant through a refrigerant passage in a cooling plate which is bonded to the electrostatic chuck 10 and not illustrated.

In the electrostatic chuck 10 of the present embodiment described above, the connection member 20 embedded in the second ceramic substrate 12 has a portion in which the area of cross section when the connection member 20 is cut by a plane parallel to the upper base 20*a* increases from the upper base 20*a* side to the lower base 20*b* side. Therefore, for example, as compared with the case where the shape of the connection member 20 is cylindrical, the area of the lateral surface of the connection member 20 is larger, thus the contact area between the second ceramic substrate 12 and the connection member 20 is increased, and the adhesion between the second ceramic substrate 12 and the connection member 20 is improved. Thus, even if a step of grinding the surface, on which the metal bonding layer 13 is formed, of the second ceramic substrate 12 in which the connection member 20 is embedded and exposing the upper base 20*a* of the connection member 20 is included when the electrostatic chuck 10 is manufactured, crack is unlikely to occur in the second ceramic substrate 12. In addition, even if a load is applied to the connection member 20 in the step, the lateral surface of the connection member 20 is caught by the second ceramic substrate 12, thus is unlikely to come off.

In addition, the second ceramic substrate 12 includes the hole 33 in the lower surface of the second ceramic substrate 12 for inserting the power supply terminal 30, and the lateral surface 30*s* of the power supply terminal 30 is bonded to the lateral surface 33*s* of the hole 33. In this manner, the lateral surface 30*s* of the power supply terminal 30 is fixed to the lateral surface 33*s* of the hole 33 of the second ceramic substrate 12, thus the connection member 20 together with the power supply terminal 30 can be prevented from coming off from the second ceramic substrate 12.

In addition, the shape of the connection member 20 is such that (here, a truncated cone shape) the area of cross section when the connection member 20 is cut by a plane parallel to the upper base 20*a* increases from the upper base 20*a* to the lower base 20*b*, thus the connection member 20 can be easily manufactured.

Note that the present invention is not limited to the above-described embodiment at all, and it is needless to say that the invention can be implemented in various aspects as long as it belongs to the technical scope of the present invention.

Figure 5:
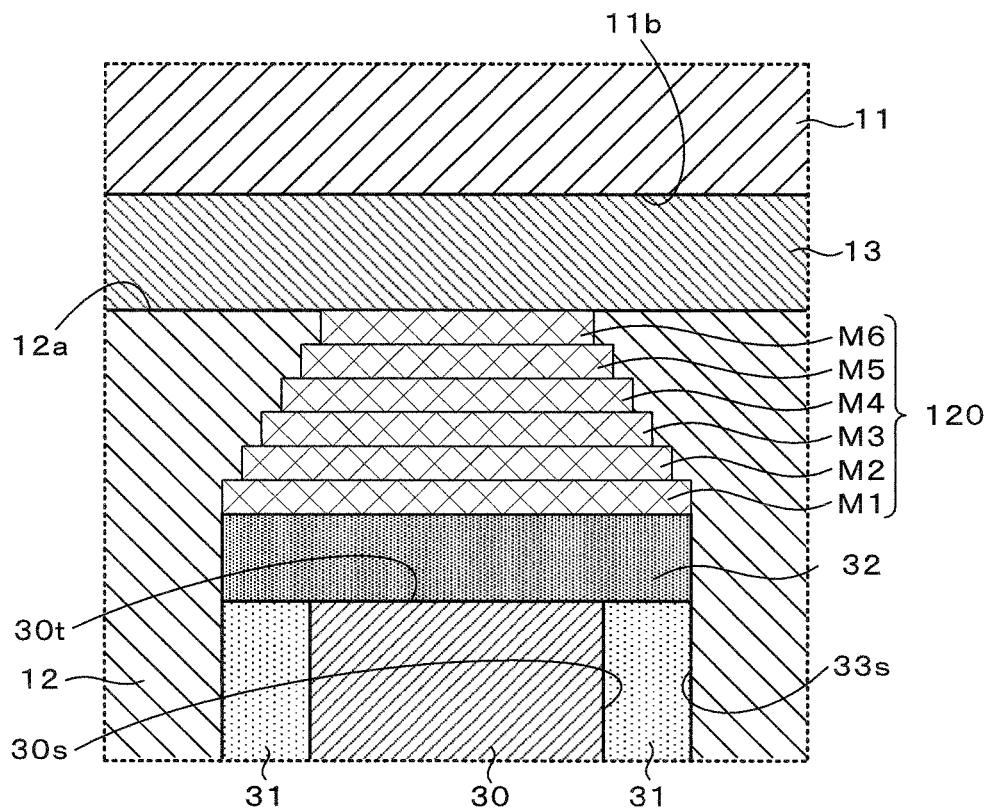
FIG. 5 is a cross sectional view of a connection member 120.

For example, in the embodiment described above, the power supply terminal 30 and the metal bonding layer 13 are connected by utilizing the connection member 20 produced by a bulk body (massive body) made of metal, however, the invention is not limited to this. For example, as illustrated in FIG. 5, the power supply terminal 30 and the metal bonding layer 13 may be connected using a connection member 120 which is formed by stacking metal meshes M1 to M6 having different diameters in multiple stages (here, six stages) in descending order of diameter from the power supply terminal 30 side. In this manner, even when the electrostatic chuck 10 is heated or cooled, the connection member 20 is likely to expand and contract because it is made of metal mesh, and ceramic enters gaps in the metal meshes M1 to M6, thus the thermal expansion coefficient becomes closer to that of the second ceramic substrate 12. Therefore, crack is unlikely to occur in the second ceramic substrate 12. Note that in FIG. 5, the same components as in the embodiment described above are labeled with the same symbol, and a description is omitted.

Figure 6:
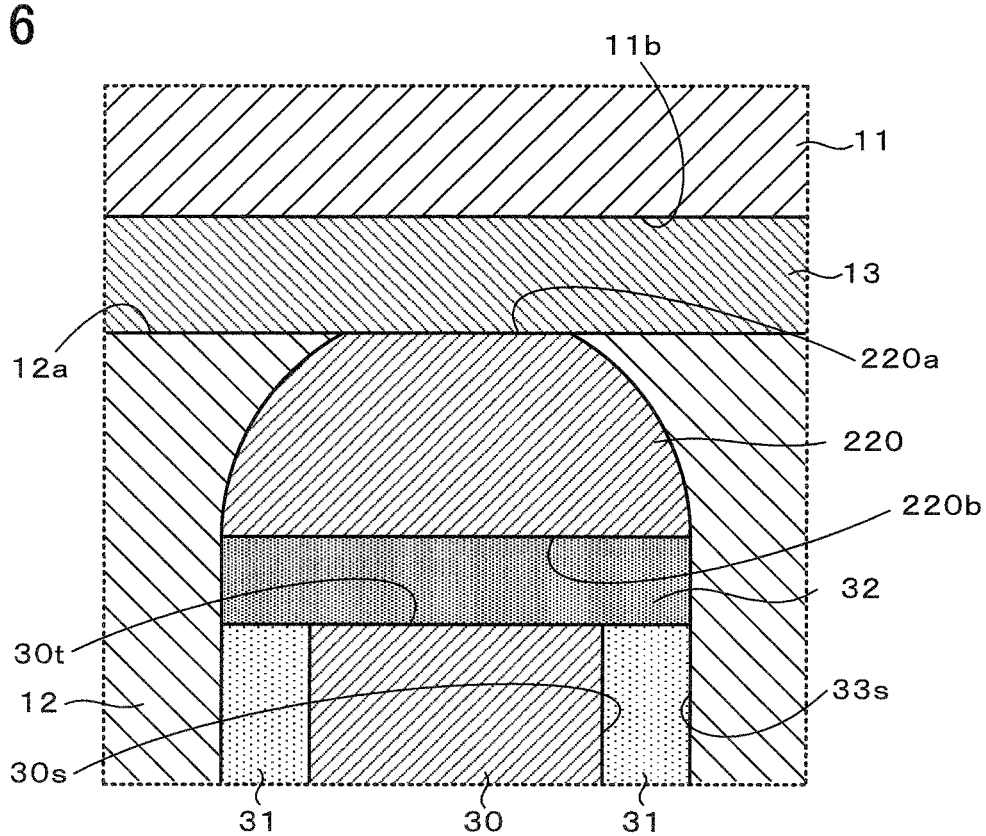
FIG. 6 is a cross sectional view of a connection member 220.
Figure 7:
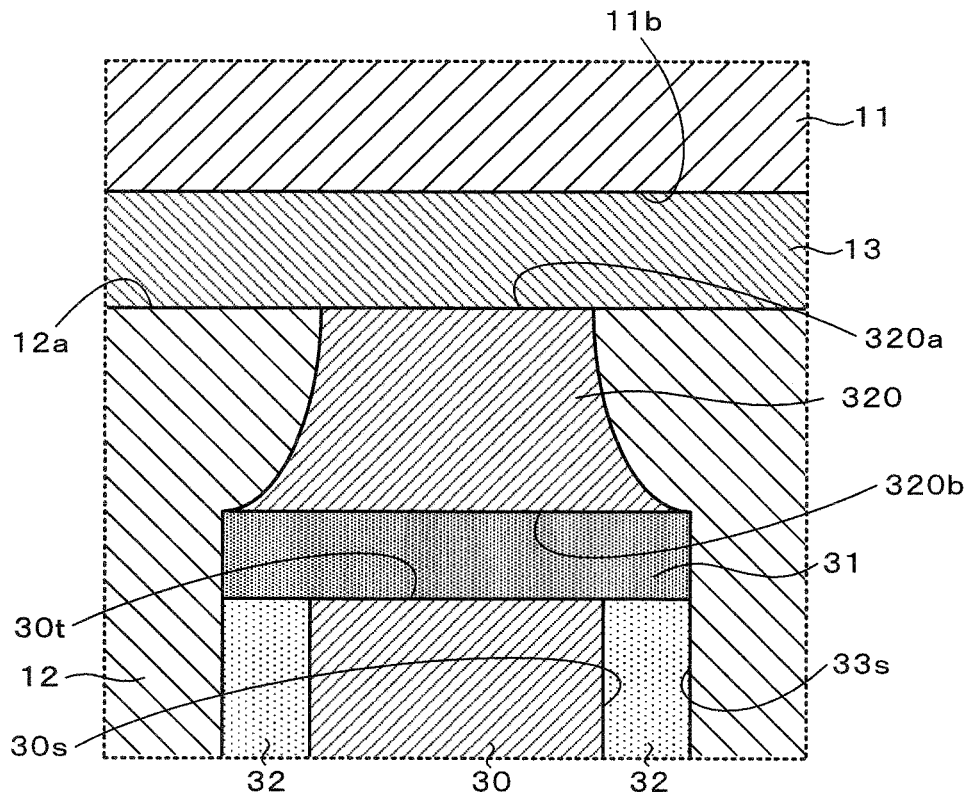
FIG. 7 is a cross sectional view of a connection member 320.
Figure 8:
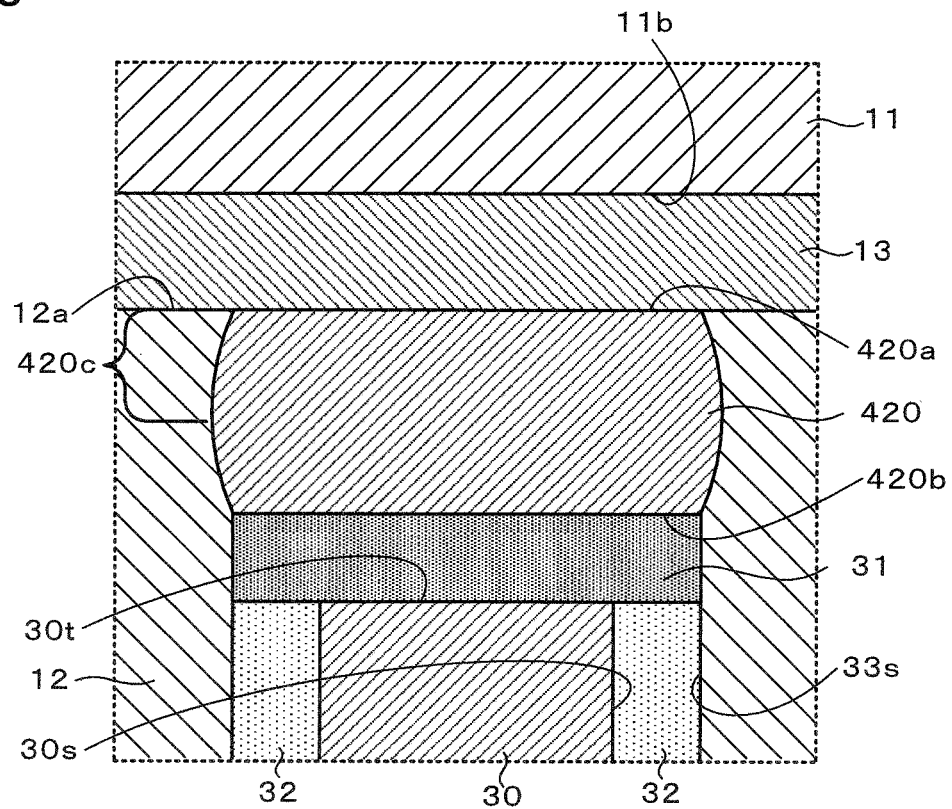
FIG. 8 is a cross sectional view of a connection member 420.
Figure 9:
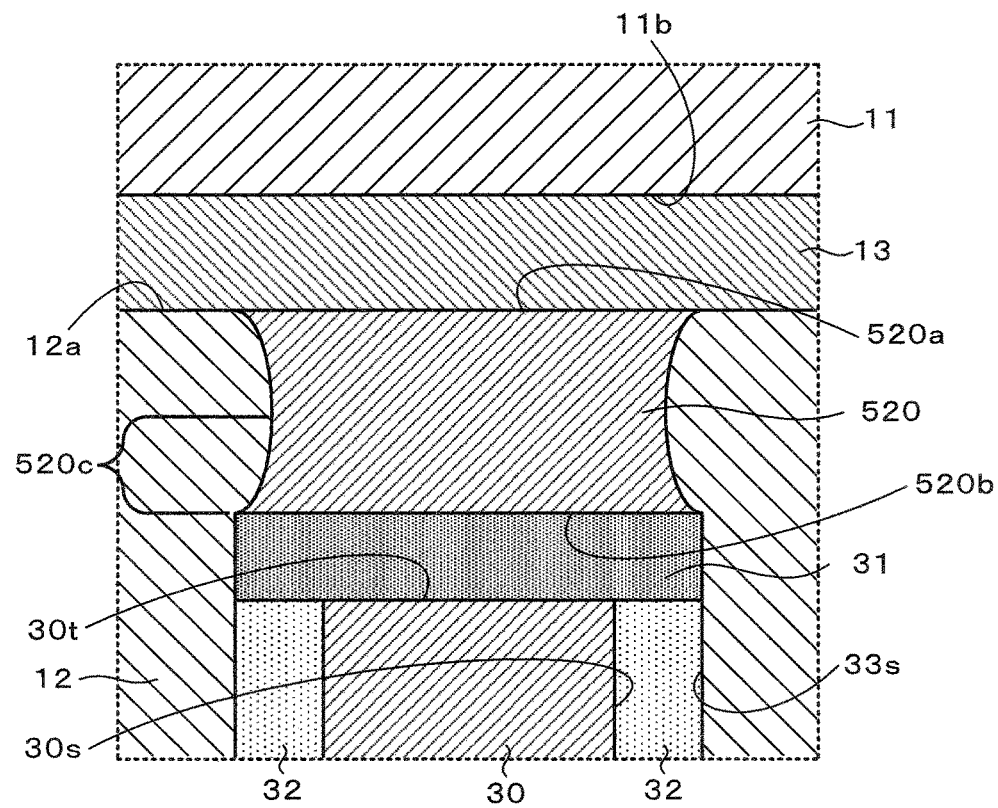
FIG. 9 is a cross sectional view of a connection member 520.

In the electrostatic chuck 10 of the embodiment described above, the connection member 20 in a truncated cone shape is used, however, the invention is not limited to this. For example, as illustrated in FIG. 6, the shape of a connection member 220 may be a truncated hemisphere shape (or a shape obtained by cutting a hemisphere by two planes parallel to the bottom surface) in which the area of cross section when the connection member 220 is cut by a plane parallel to its upper base 220*a* increases from an upper base 220*a* side to a lower base 220*b* side. Alternatively, as illustrated in FIG. 7, the shape of a connection member 320 may be a konide shape (shape of a truncated cone with a lateral surface inwardly curved) in which the area of cross section when the connection member 320 is cut by a plane parallel to its upper base 320*a* increases from an upper base 320*a* side to a lower base 320*b* side. Alternatively, as illustrated in FIG. 8, a connection member 420 may be a barrel shape having a portion 420*c* in which the area of cross section when the connection member 420 is cut by a plane parallel to its upper base 420*a* increases from an upper base 420*a* side to a lower base 420*b* side. Alternatively, as illustrated in FIG. 9, a connection member 520 may be a shape (shape of a cylinder with a lateral surface inwardly curved) having a portion 520*c* in which the area of cross section when the connection member 520 is cut by a plane parallel to its upper base 520*a* increases from an upper base

Figure 10:
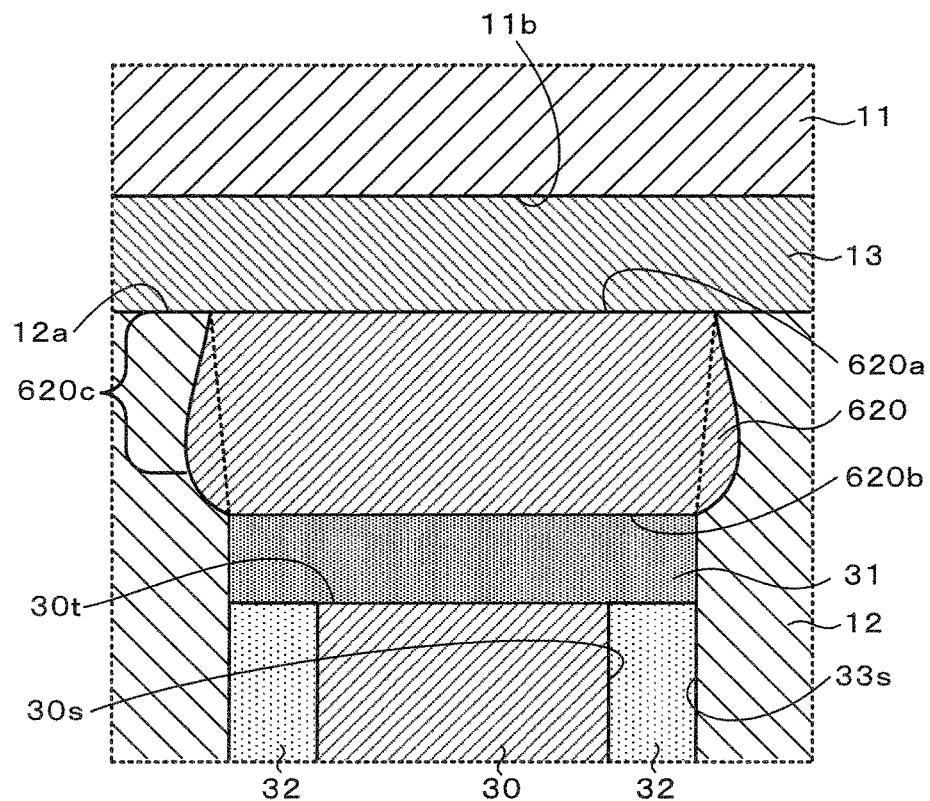
FIG. 10 is a cross sectional view of a connection member 620.

520a side to a lower base 520b side. Alternatively, as illustrated in FIG. 10, a connection member 620 may be a shape (a barrel shape with a lateral surface having a bulged lower portion) having a portion 620c in which the area of cross section when the connection member 620 is cut by a plane parallel to its upper base 620a increases from an upper base 620a side to a lower base 620b side. In FIG. 6 to FIG. 10, the same components as in the embodiment described above are labeled with the same symbol, and a description is omitted. The connection members 220, 320, 420, 520, 620 each have a larger area of the lateral surface as compared with the case where the shape of each connection member is cylindrical, thus even if a step of exposing the upper bases 220a, 320a, 420a, 520a, 620a by grinding the lower surface 12b of the second ceramic substrate 12 is included, crack is unlikely to occur in the second ceramic substrate 12. In addition, even if a load is applied to the connection members 220, 320, 420, 520, 620 in the step, the lateral surface of each of the connection members 220, 320, 420, 520, 620 is caught by the second ceramic substrate 12, thus is unlikely to come off.

In the embodiment described above, the metal bonding layer 13 is used as an electrostatic electrode, however, the invention is not limited to this. For example, the metal bonding layer 13 may be used as a ground electrode. In this case, the metal bonding layer 13 is connected to the ground, and the electrostatic electrode may be embedded in the first ceramic substrate 11 so as to be parallel to the resistance heating element 14.

In the embodiment described above, the end face 30t of the power supply terminal 30 and the lower base 20b of the connection member 20 are bonded via the terminal lateral surface bonding layer 32 comprised of the ceramic powder 41 and the metal wax material 42, however, the invention is not limited to this. For example, the terminal lateral surface bonding layer 32 may not include the ceramic powder 41, and may be comprised of the metal wax material 42. In this case, in step (4), it is sufficient that the power supply terminal 30 be inserted in the hole 33 with the ceramic powder 41 not placed but the metal wax material 42 placed on the lower base 20b of the connection member 20, and the metal wax material 42 be melted, then cooled and solidified in the same manner as in the above-described embodiment.

In the embodiment described above, when the electrostatic chuck 10 is manufactured, the power supply terminal 30 is connected to the connection member 20, then the bonding surface 12a is formed by grinding the upper surface 12c of the second ceramic substrate 12, and the first ceramic substrate 11 and the second ceramic substrate 12 are bonded, however, the invention is not limited to this. For example, after the bonding surface 12a is formed by grinding the upper surface 12c of the second ceramic substrate 12, the lower surface 12b may be provided with the hole 33, the power supply terminal 30 may be connected to the connection member 20, and the first ceramic substrate 11 and the second ceramic substrate 12 may be metal bonded. Alternatively, after the bonding surface 12a is formed by grinding the upper surface 12c of the second ceramic substrate 12, and the first ceramic substrate 11 and the second ceramic substrate 12 are metal bonded, the hole 33 may be formed in the lower surface 12b, and the power supply terminal 30 may be connected to the connection member 20.

In the embodiment described above, an RF electrode may be embedded in the first ceramic substrate 11 or the second ceramic substrate 12. The RF electrode is an electrode to be utilized when a plasma is generated.

The present application claims priority of Japanese Patent Application No. 2021-007360 filed on Jan. 20, 2021, the entire contents of which are incorporated herein by reference.

What is claimed is:

1. A wafer placement table comprising:
a first ceramic substrate having a wafer placement surface on an upper surface;
a second ceramic substrate disposed on a lower surface side of the first ceramic substrate;
a metal bonding layer that bonds the lower surface of the first ceramic substrate and an upper surface of the second ceramic substrate;
a connection member including an upper base and a lower base, the connection member being embedded in the second ceramic substrate with the upper base in contact with the metal bonding layer; and
a power supply terminal electrically connected to the lower base of the connection member,
wherein the connection member has a portion in which two areas of cross section when the connection member is cut by a pair of parallel planes to the upper base increases from a side of the upper base to a side of the lower base, and
wherein the connection member is a member in which metal meshes are stacked in multiple stages.

2. The wafer placement table according to claim 1, wherein the second ceramic substrate has a hole in a lower surface of the second ceramic substrate, the hole for inserting the power supply terminal, and
a lateral surface of the power supply terminal is bonded to a lateral surface of the hole.

3. The wafer placement table according to claim 1, wherein a shape of the connection member is such that the two areas of cross section when the connection member is cut by a pair of parallel planes to the upper base increases from the upper base to the lower base.

4. The wafer placement table according to claim 3, wherein the shape of the connection member is a truncated cone shape, a truncated hemisphere shape or a shape having a lateral surface inwardly curved as compared with the truncated cone shape.

5. A method of manufacturing a wafer placement table, the method comprising:
(a) a step of preparing a first ceramic substrate having a wafer placement surface on an upper surface, and a second ceramic substrate in which a connection member including an upper base and a lower base is embedded;
(b) a step of forming a bonding surface by grinding the second ceramic substrate so as to expose the upper base of the connection member; and
(c) a step of metal bonding a lower surface of the first ceramic substrate and the bonding surface of the second ceramic substrate,
wherein the connection member embedded in the second ceramic substrate prepared in step (a) has a portion in which two areas of cross section when the connection member is cut by a pair of parallel planes to the upper base increases from a side of the upper base to a side of the lower base, and
wherein the connection member is a member in which metal meshes are stacked in multiple stages.

6. A wafer placement table comprising:
a first ceramic substrate having a wafer placement surface on an upper surface;

a second ceramic substrate disposed on a lower surface side of the first ceramic substrate;

a metal bonding layer that bonds the lower surface of the first ceramic substrate and an upper surface of the second ceramic substrate;

a connection member including an upper base and a lower base, the connection member being embedded in the second ceramic substrate with the upper base in contact with the metal bonding layer; and a power supply terminal electrically connected to the lower base of the connection member, wherein a shape of the connection member is such that two areas of cross section when the connection member is cut by a pair of parallel planes to the upper base increases from the upper base to the lower base, and wherein the shape of the connection member is a truncated hemisphere shape or a shape having a lateral surface inwardly curved as compared with a truncated cone shape.

* * * * *